(12) United States Patent
Kim

(10) Patent No.: US 7,907,392 B2
(45) Date of Patent: Mar. 15, 2011

(54) PLASMA DISPLAY DEVICE AND COUPLING BOSS THEREFOR

(75) Inventor: Myoung-kon Kim, Suwon (KR)

(73) Assignee: Samsung SDI Co., Ltd., Yongin-si (KR)

( * ) Notice: Subject to any disclaimer, the term of this patent is extended or adjusted under 35 U.S.C. 154(b) by 379 days.

(21) Appl. No.: 12/103,624

(22) Filed: Apr. 15, 2008

(65) Prior Publication Data

US 2008/0259547 A1  Oct. 23, 2008

(30) Foreign Application Priority Data

Apr. 18, 2007 (KR) ........................ 10-2007-0037920

(51) Int. Cl.
*H05K 7/14* (2006.01)
(52) U.S. Cl. .................... 361/679.21; 313/582
(58) Field of Classification Search ............. 361/679.21; 313/582
See application file for complete search history.

(56) References Cited

U.S. PATENT DOCUMENTS

| | | | |
|---|---|---|---|
| 6,353,512 B1 | 3/2002 | Yoneda | |
| 6,542,372 B1 * | 4/2003 | Paquin et al. | 361/758 |
| 7,259,958 B2 * | 8/2007 | Bang et al. | 361/679.27 |
| 7,394,186 B2 * | 7/2008 | Kim | 361/679.27 |
| 7,564,680 B2 * | 7/2009 | Kim et al. | 361/679.21 |
| 7,706,139 B2 * | 4/2010 | Kim | 361/679.21 |
| 2005/0047100 A1 | 3/2005 | Kim | |
| 2006/0044745 A1 * | 3/2006 | Kim | 361/681 |
| 2006/0160387 A1 | 7/2006 | Kim et al. | |
| 2006/0192730 A1 | 8/2006 | Kim et al. | |
| 2006/0223347 A1 | 10/2006 | Kim | |
| 2008/0007903 A1 * | 1/2008 | Kim et al. | 361/681 |
| 2008/0122739 A1 | 5/2008 | Kim | |
| 2008/0314112 A1 * | 12/2008 | Park et al. | 72/347 |

FOREIGN PATENT DOCUMENTS

| | | |
|---|---|---|
| KR | 1998-050107 | 10/1998 |
| KR | 10-2006-0095604 | 9/2006 |

OTHER PUBLICATIONS

Korean Patent Abstracts, Publication No. 1020060095604 A, dated Sep. 1, 2006, in the name of Myoung Kon Kim.
European Search Report dated Jul. 8, 2010, for corresponding European Patent application 08154554.3, noting listed references in this IDS.

\* cited by examiner

*Primary Examiner* — Peter Macchiarolo
(74) *Attorney, Agent, or Firm* — Christie, Parker & Hale, LLP

(57) ABSTRACT

A plasma display device and a coupling boss coupleable to a chassis base of the plasma display device. The coupling boss includes an attaching head at one end of a boss cylinder. The attaching head has a horizontal cross-sectional area larger than a horizontal cross-sectional area of the boss cylinder. A supporting jaw is proximal to the attaching head and protrudes from the boss cylinder. An undercut is provided between the attaching head and the supporting jaw, the undercut having a volume substantially the same as a volume of the supporting jaw.

16 Claims, 8 Drawing Sheets

FIG. 3A
FIG. 3B
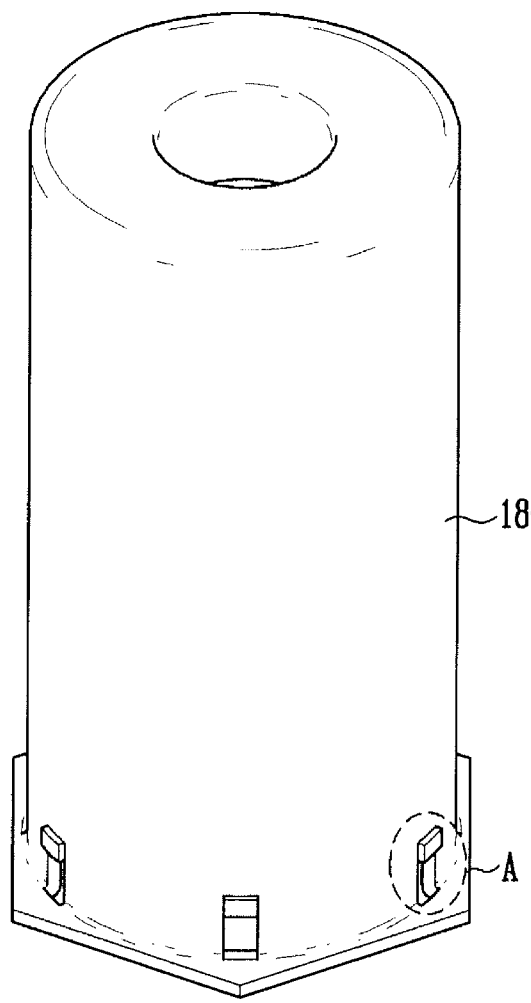
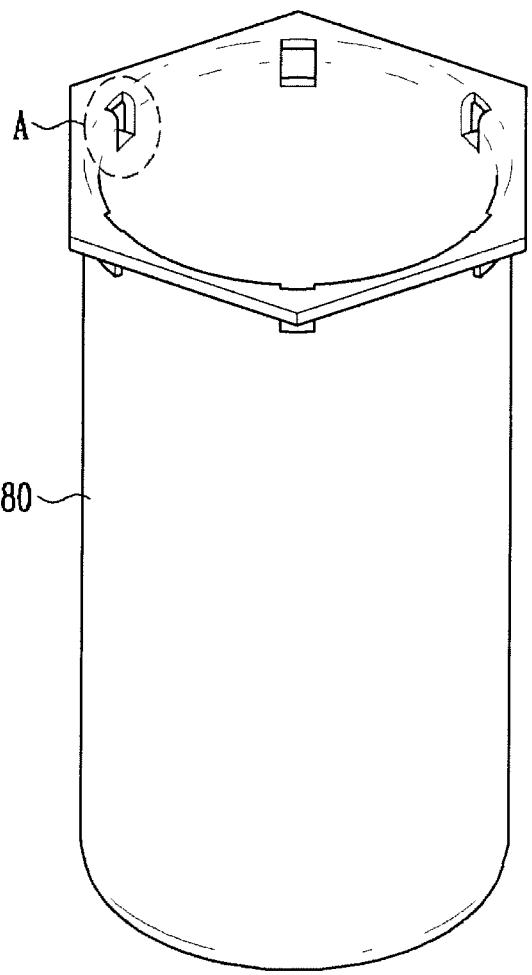

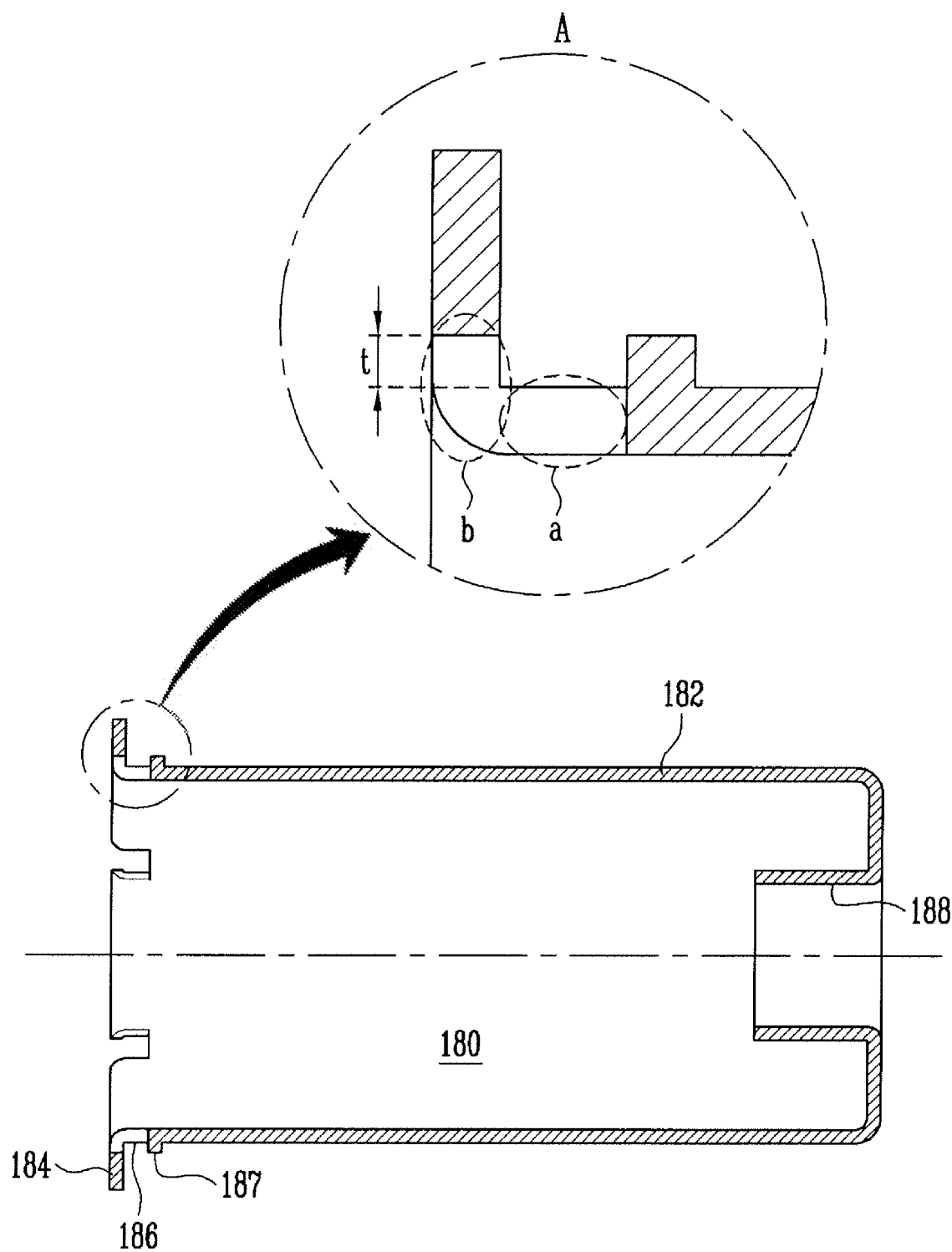

PLASMA DISPLAY DEVICE AND COUPLING BOSS THEREFOR

CROSS-REFERENCE TO RELATED APPLICATION

This application claims priority to and the benefit of Korean Patent Application No. 10-2007-0037920, filed on Apr. 18, 2007, in the Korean Intellectual Property Office, the entire content of which is incorporated herein by reference.

BACKGROUND

1. Field of the Invention

The present invention relates to a boss, and, in particular, to a coupling boss attachable to a chassis base of a plasma display device for coupling a control circuit, a PCB, etc., to the chassis base during the plasma display device fabrication process.

2. Description of the Related Art

A plasma display device generally includes a panel unit, a circuit unit, and a support mechanism. The support mechanism performs a role supporting a plasma display panel (PDP), and a circuit board, and typically may include a chassis, a reinforcing member, and a various kind of bosses. For example, the plasma display panel is attached by a double-faced adhesive tape on one side surface of the chassis and the boss is coupled to another side surface of the chassis in order to support the circuit unit.

The boss typically has a small cylindrical shape, and is attached to and protrudes from the plane of a chassis base. The boss is typically separately fabricated and then attached to the chassis base by means of a press-inserting process.

FIG. 1 shows a cross-sectional view of a conventional plasma display device. The conventional plasma display device includes a filter 101, a plasma display panel 102, a double-faced adhesive tape 104, a chassis base 106, a circuit board 107, bosses 108, and gaskets 105 for electrically connecting the plasma display panel 102 and the circuit board 107. FIG. 2 shows a cross-sectional view of a conventional plasma display device of FIG. 1.

As shown in the FIG. 2, a head portion 1084, which is an end where the boss 108 is press-inserted into the chassis base 106, has a larger diameter than that of a boss cylinder 1082, which is the outer wall of the boss 108, is provided with a head 1084 formed in a disc shape and located at the lowest portion. A coupling groove 1086 has a smaller diameter than that of the boss cylinder 1082 and is located between the head 1084 and the boss cylinder 1082. A threaded portion 1088 is located at an end opposite head 1084.

When the boss 108 having the head 1084 is press-inserted into the chassis base 106, the material of the chassis base 106 is pushed into the vicinity of the coupling groove 1086, and the head 1084 and the boss cylinder 1082 forming the coupling groove 1086 are engaged with the pushed partial material of the chassis base 106 so that a sufficient attaching strength can be obtained.

However, the boss is typically fabricated by means of a forging method, wherein the processing of the coupling groove and the head of the boss is possible only when the thickness of the chassis is greater than 0.8 mm. The processing of the coupling groove and the head of boss becomes difficult and the pull-out force is considerably reduced when the thickness of the chassis is below 0.8 mm.

Recently, improvements in the support mechanisms have been desired for weight reduction and for simplification of a plasma display device. In this regard gradually reducing the thickness of the chassis has been suggested (e.g., from 2.5 mm to 2.0 mm to 1.5 mm to 1.0 mm to 0.8 mm to 0.6 mm). However, the fabrication cost for fabricating the boss according to the related art has increased due to the degree of difficulty of processing such improvements.

The forging method used in boss fabrication has a comparatively high cost. Also, since the coupling groove formed in the boss according to the related art is fabricated by means of a separate process (post-processing) after fabricating the boss cylinder and the head, the fabrication cost further increases.

SUMMARY OF THE INVENTION

In accordance with the present embodiment a boss having a low fabrication cost, and a plasma display device equipped with the boss, is provided.

The boss is capable of being fabricated by means of a press method and provides a securing coupling force with a chassis base of the plasma display device.

In an exemplary embodiment the boss includes: a boss cylinder; an attaching head at one end of the boss cylinder, the attaching head having a horizontal cross-sectional area larger than a horizontal cross-sectional area of the boss cylinder; a supporting jaw proximal to the attaching head and protruding from the boss cylinder; and an undercut between the attaching head and the supporting jaw, the undercut having a volume substantially the same as a volume of the supporting jaw.

In an exemplary embodiment a plasma display device includes a plasma display panel. A chassis base is attached to a surface of the plasma display panel distal from the plasma display panel. A boss protrudes from the chassis base. A control circuit board is coupled to the boss, wherein the boss comprises: a boss cylinder; an attaching head at one end of the boss cylinder, the attaching head having a horizontal cross-sectional area larger than a horizontal cross-sectional area of the boss cylinder; a supporting jaw proximal to the attaching head and protruding from the boss cylinder; and an undercut between the attaching head and the supporting jaw, the undercut having a volume substantially that same as that of the supporting jaw.

The attaching head may include means for preventing rotation when coupled with a chassis base.

The horizontal cross-sectional area of the attaching head may be polygonal.

A connection hole may be at an end of the boss cylinder distal from the attaching head.

The connection hole may be threaded.

The boss cylinder, the attaching head, the supporting jaw, and the undercut may be integrally formed.

The boss may be press-insertable into a chassis base, and the attaching head and the supporting jaw are each engaged with the chassis base upon the boss being press-inserted into the chassis base.

The attaching head may be depressed into the chassis base after a press-inserting process.

BRIEF DESCRIPTION OF THE DRAWINGS

FIGS. 3A and 3B are respective upright and inverted perspective views showing a boss according to an exemplary embodiment of the present invention.

FIG. 4 is a detailed cross-sectional view of a cross-sectional structure of the boss in FIG. 3.

DETAILED DESCRIPTION

Figure 1:
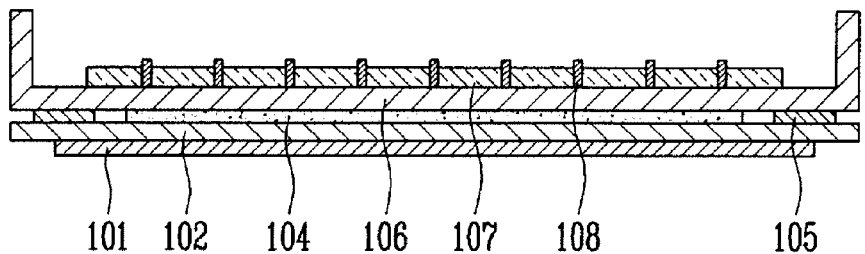
FIG. 1 is a schematic cross-sectional view of an assembled structure of a conventional plasma display device.
Figure 2:
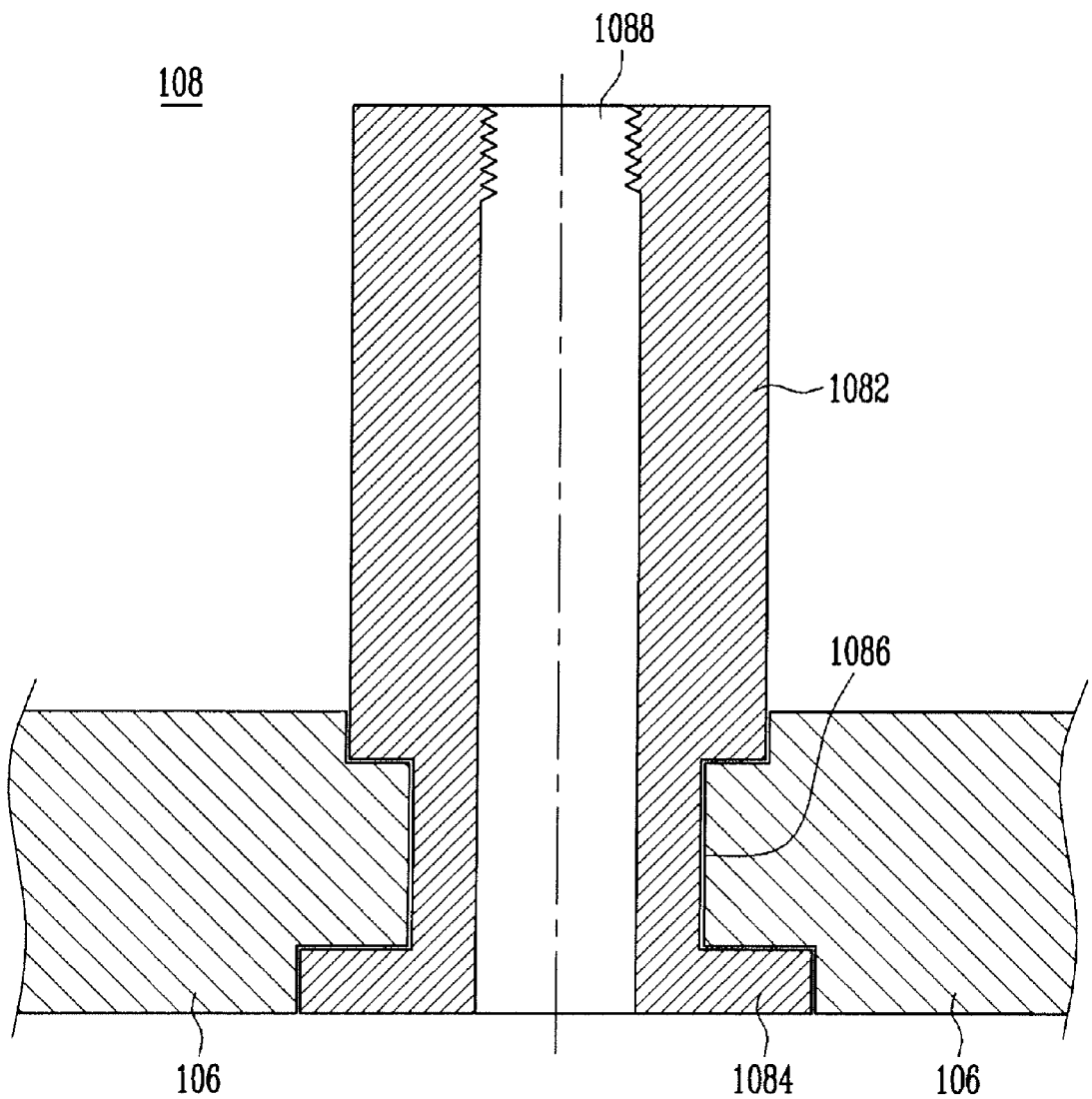
FIG. 2 is a cross-sectional view of the junction between a boss and a chassis base of the conventional plasma display device of FIG. 1.

Referring to FIGS. 3A, 3B, 4, and 5, a boss 180 according to an exemplary embodiment includes a cylindrical boss cylinder 182 and an attaching head 184 formed at one end of the boss cylinder 182 which depressed into a chassis base 106 after a press-inserting process. A supporting jaw 187 is formed by cutting a portion of the boss cylinder 182 and protruding it to the outside in order to be engaged with the chassis base 106 together with the attaching head 184. An undercut 186 has a shape resulting from a region of the boss cylinder 182 forming the supporting jaw 187 being emptied in order to make the supporting jaw 187.

The boss 180 according to the present embodiment is easily fabricated by means of a press method and fabrication cost is reduced.

To this end, the boss cylinder 182 has a cylinder shape for easy pressing, an attaching head 184 formed at one end thereof, and a tap portion 188 having a connection structure such as a screw thread or a wire hole formed at an opposite end. The attaching head 184 has a shape expanding in a direction from the center axis of the boss cylinder 182 toward an outer circumference. The outline of the attaching head 184 has a polygonal shape (e.g., an exemplary embodiment being a hexagon in the drawings), or may be in the form of a sill or a groove (not shown), making it possible to prevent the rotation of the boss 180 when the boss 180 has been press-inserted into the chassis base 106.

Although the coupling strength between the boss 180 the chassis base 106 is provided by the attaching head 184, the coupling strength alone provided by the attaching head 184 may not be sufficient in certain applications. In order to increase the coupling strength between the boss 180 and the chassis base 106, a supporting jaw 187 is provided strongly engaging a predetermined portion of the chassis base together with the attaching head 106 after press-insertion.

In accordance with an exemplary embodiment the supporting jaw 187 also has a structure capable of being formed by means of the press method to reduce the fabrication cost of the boss 180. To this end, the supporting jaw 187 is formed in a shape protruding in the outer circumference direction after a predetermined region in the vicinity of the attaching head 184 of the boss cylinder 182 is cut.

Referring to the enlarged detail shown in encircled portion A, in order to simultaneously mold the supporting jaw 187 during a press process molding the boss cylinder 182, a portion a of the boss cylinder 182 forming the supporting jaw 187 as well as a portion b of the attaching head 184 is cut to allow them to be included in an undercut 186. Then, pressure (press) is applied in a direction from the attaching head 184 toward the tap portion 188 to allow the portion a of the boss cylinder and the portion b of the attaching head to be pushed up so that the supporting jaw 187 is formed by the material pushed up and in the outer circumference direction.

When a portion of the attaching head is cut to be included in the undercut as described above, the strength of the attaching head itself can be lowered by the undercut. Therefore, in the case where the attaching head 184 is fabricated in the polygonal shape, it is implemented so that the undercut 186 is formed at the apex region of the polygon having a comparatively large volume in the region of the attaching head 184, as shown in the FIGS. 3A and 3B.

Figure 5:
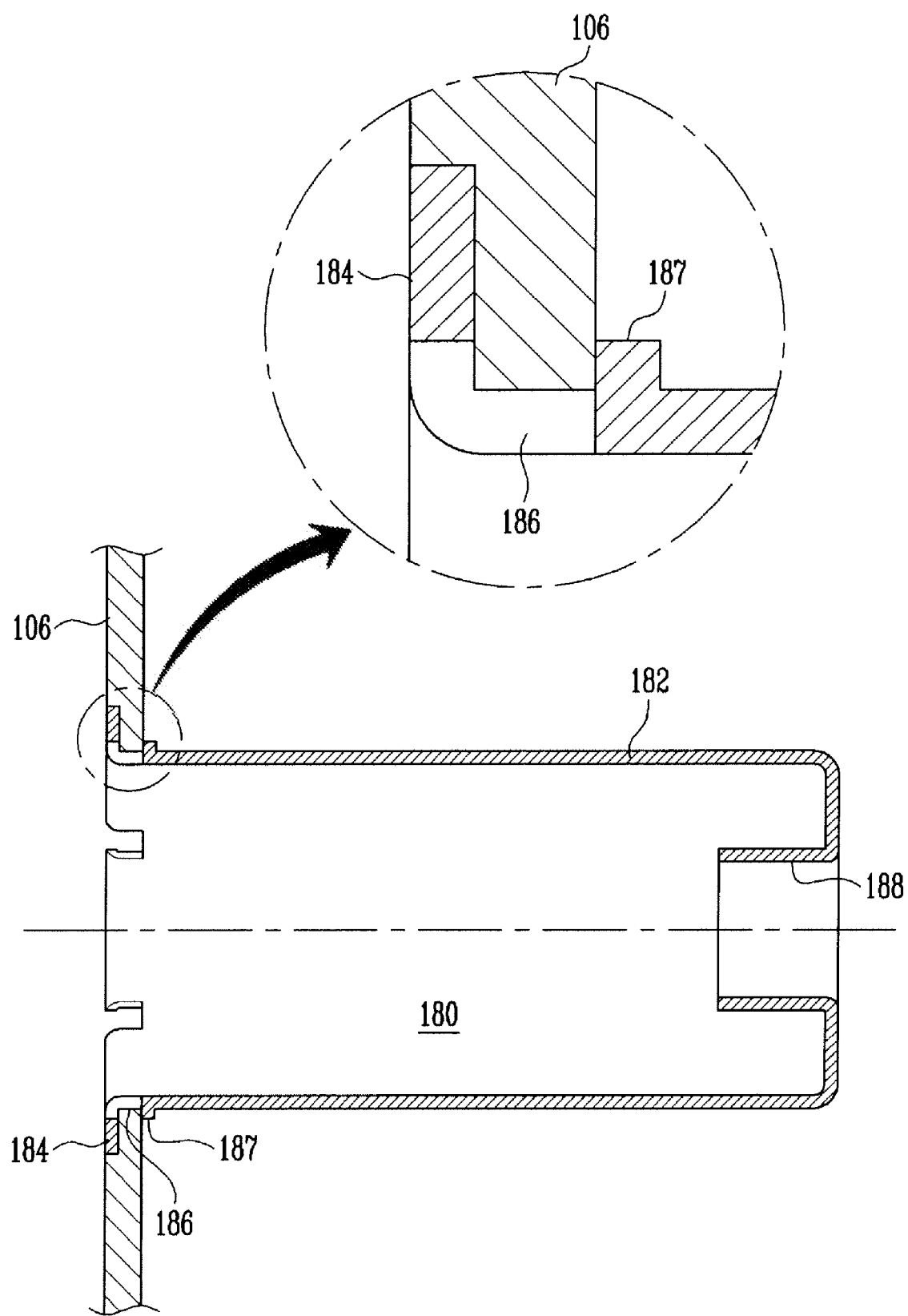
FIG. 5 is a cross-sectional view of an attaching structure between a boss in FIG. 3 and a chassis base of a plasma display panel.
Figure 6A:
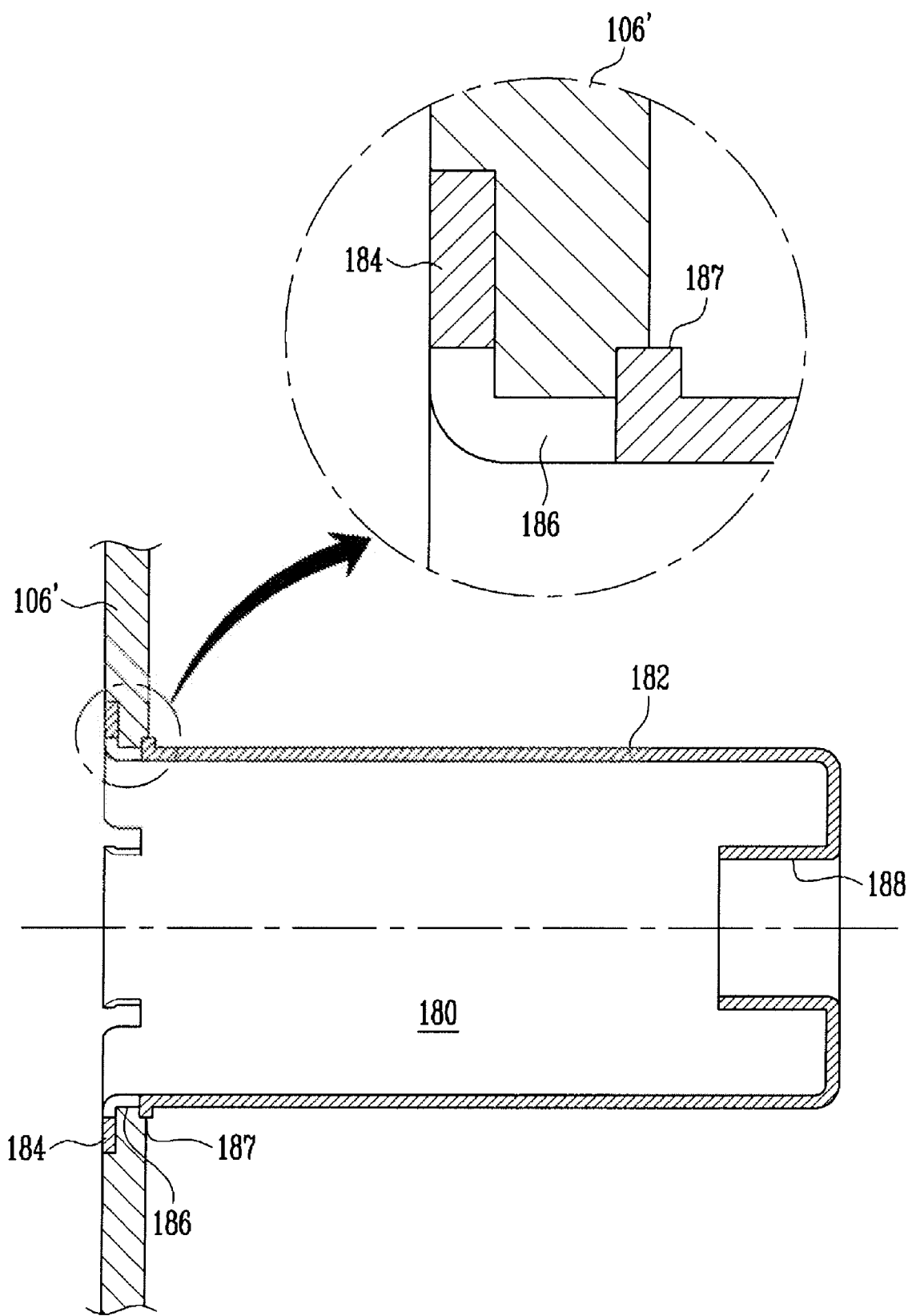
FIGS. 6A and 6B are cross-sectional views of attaching structures between a boss in FIG. 3 and a chassis base of a plasma display panel having different thickness.
Figure 6B:
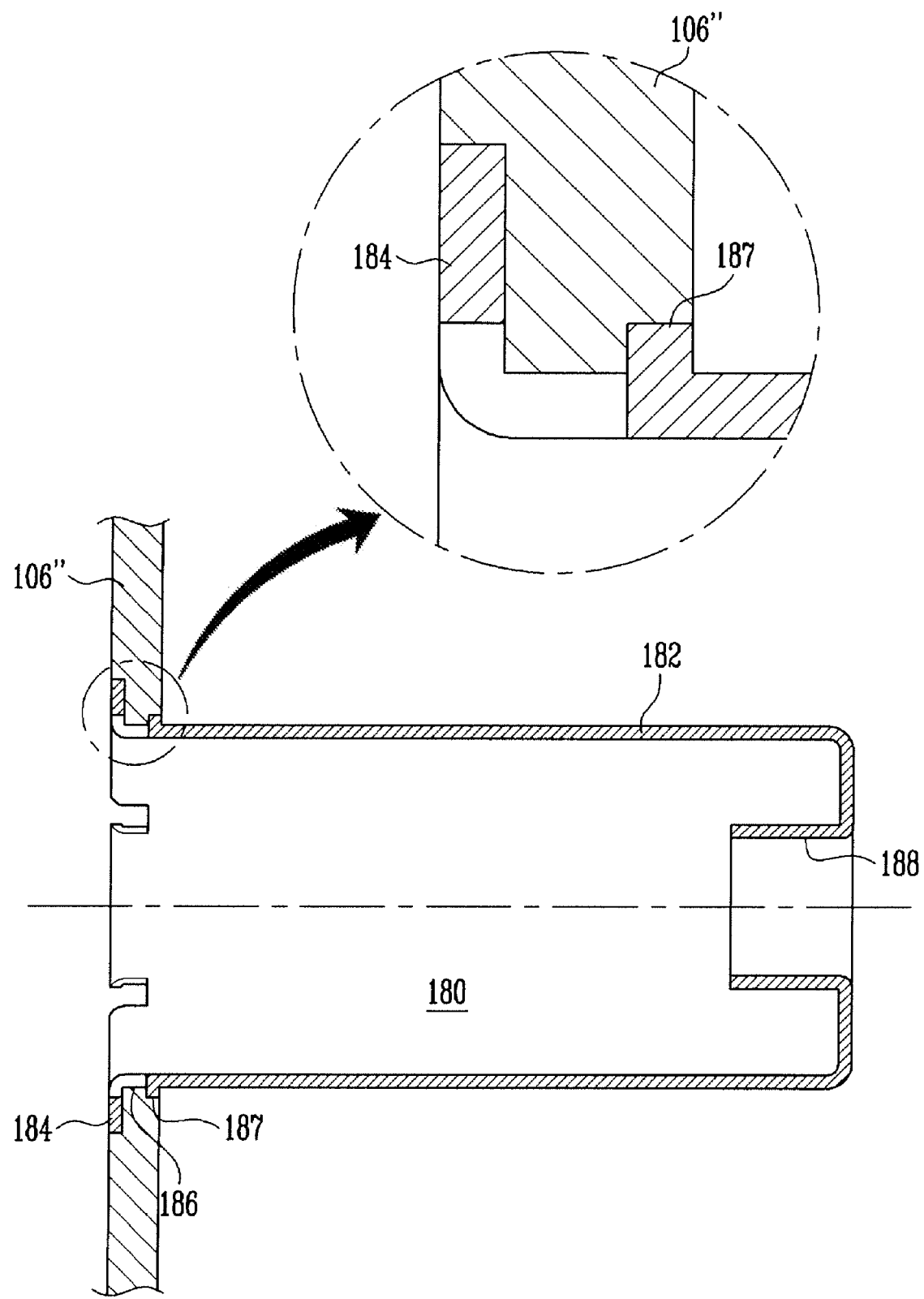

Referring to FIGS. 6A and 6B, although the thickness of the chassis bases 106', 106" shown in FIGS. 6A and 6B is thicker than the chassis base 106 shown in FIG. 5, the supporting jaw is buried in the chassis base to some degree, making it possible to be smoothly applied to the press-inserting process.

Figure 7A:
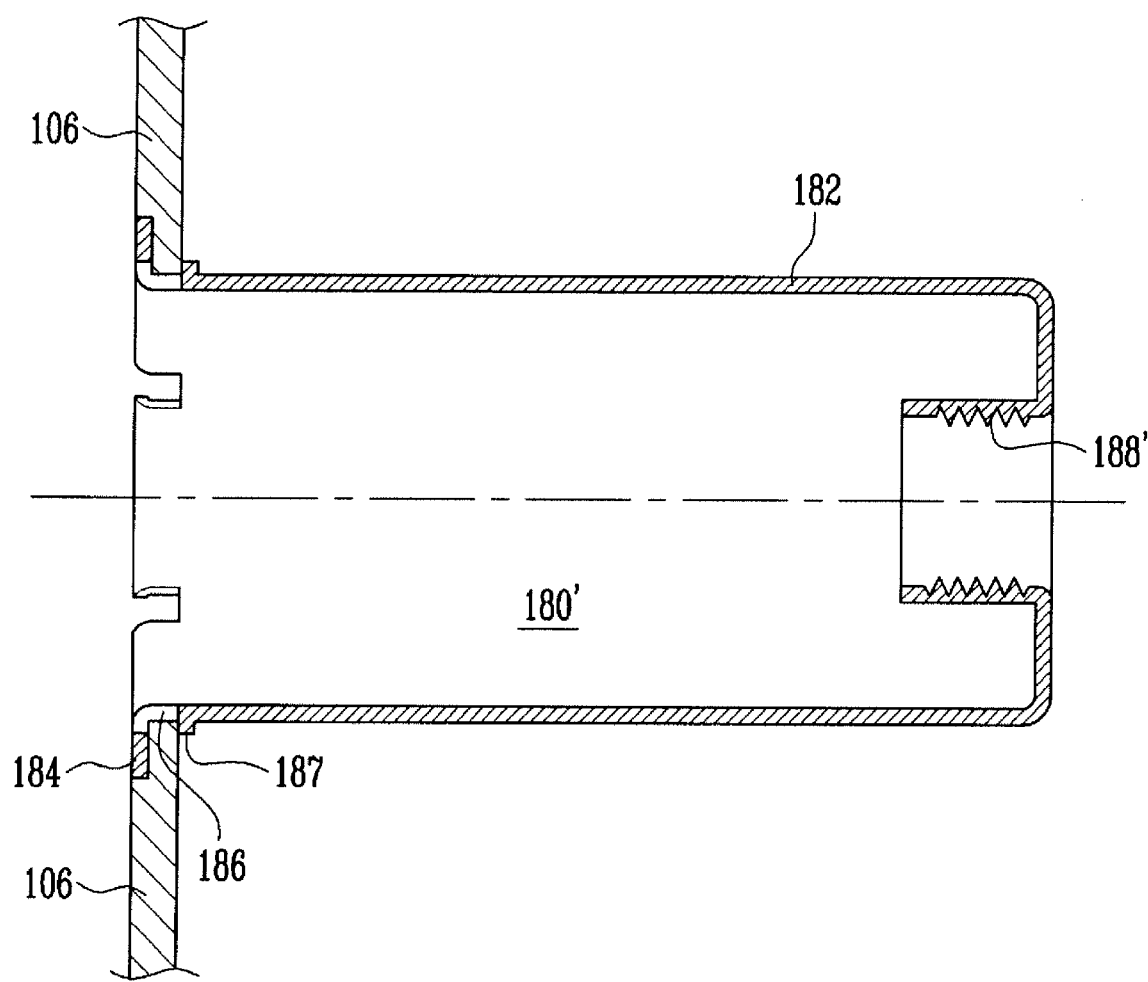
FIGS. 7A and 7B are cross-sectional views showing implement for a tap portion of the boss according to one embodiment of the present invention.

The tap portion shown in the drawings can have a variety of shapes depending on the purpose of the boss. For example, if the boss is to screw-couple a PCB, etc., a tap portion 188' having a structure that a screw thread is formed in the inside surface thereof, as shown in FIG. 7A. If the boss is to pass lines for transferring data or power, a tap portion having a structure with a hole capable of passing the line are formed. In any event, the tap portion is typically at least greater 2 mm, and to this end, can be implemented be means of a drawing method in the press method.

Figure 7B:
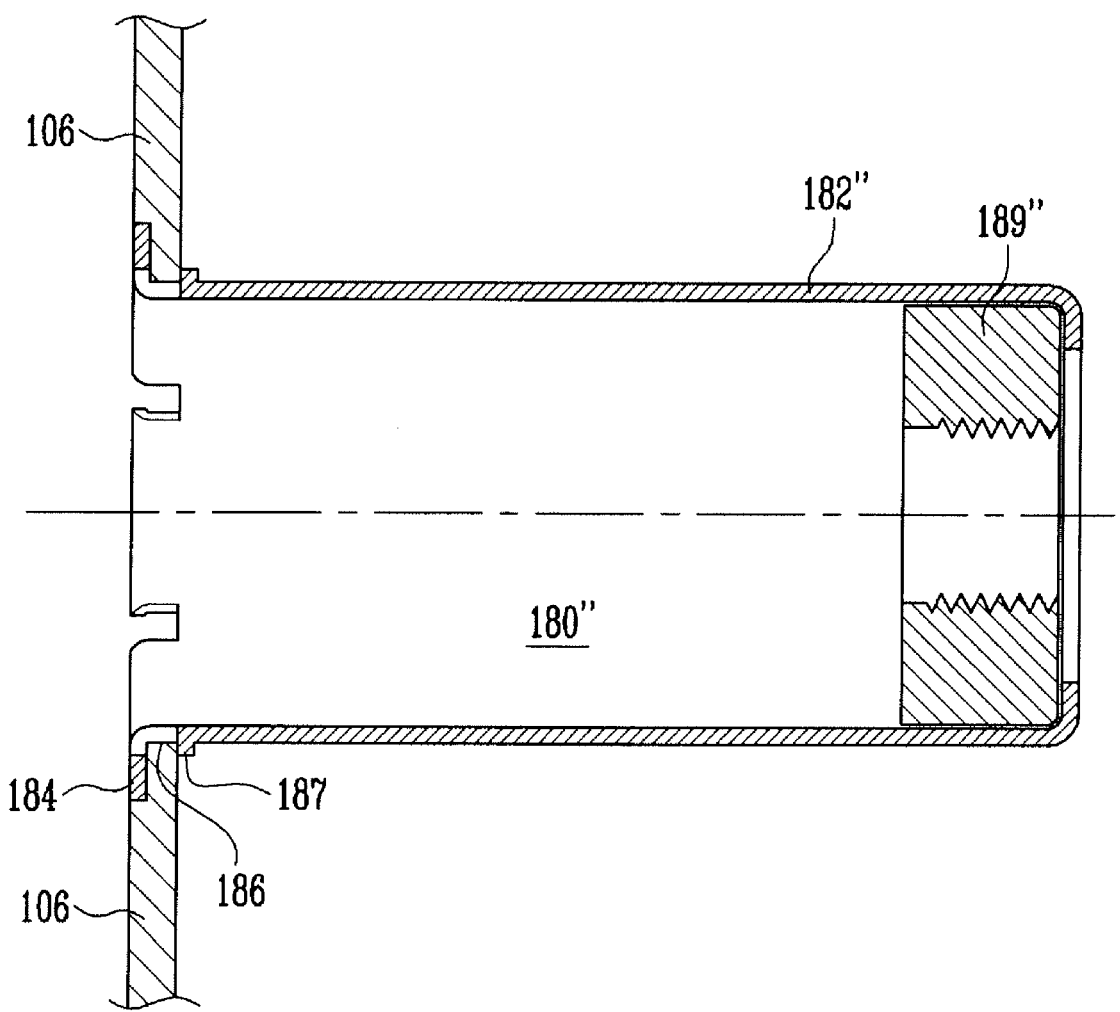

In addition, the tap portion can be formed by means of a variety of other methods. For example, while the tap can be formed up to the inside surface thereof by means of the press method in order to reduce the fabrication cost, as shown in FIGS. 3 to 7, it can be also formed by separately fabricating one surface in a ring shape forming the tap portion 189" and press-coupling it to the inside of the boss cylinder 182" of boss 180" in order to increase the strength of the tap portion, as shown in FIG. 7B.

Hereinafter, a process in accordance with the present embodiment for press-inserting the boss into the chassis base and the strength after press-inserting it will be described.

FIG. 5 shows a structure such that the chassis base 106 and the boss 180 are attached after a press-insertion process. The boss 180 is inserted in the chassis base 106 in which a hole for attaching the boss is formed, and the inlet of the hole for attaching the boss is pressed, so that the boss press-inserting process is completed. Here, when the boss 180 is press-inserted into the hole of a surface (e.g., plasma display panel is coupled thereto) of the chassis base 106, the supporting jaw 187 of the boss crosses the edge of the hole of the chassis base 106 from the inlet of the hole to the outlet of the hole, and the edge of the hole of the chassis base 106 is filled between supporting jaw 187 and the attaching head 184 and in a partial space of the undercut 186 so that a strong coupling force is secured.

In addition, the present embodiment can allow the coupling force to be adjusted depending on the positions of the undercut and the supporting jaw, and the thickness of the boss material, thereby making it possible to freely select the thickness of the chassis base. In the related art, when the thickness of the chassis is below 0.8 mm, processing is very difficult when the boss if formed by forging.

The boss according to the present embodiment is provided with the supporting jaw for coupling with the chassis base, wherein the supporting jaw increases the coupling force of the boss and prevents the boss from being separated from the chassis base. The supporting jaw is formed on the upper portion of the chassis base by the undercut so that although the thickness of the chassis material becomes thin, the coupling force can be maintained.

Table 1 below compares the strengths in the cases: (1) where the boss is fabricated by means of the press method with a low fabrication cost according to the present embodiment and (2) where the boss is fabricated by means of the forging method according to the related art, and are press-inserted into the chassis base.

TABLE 1

|  | (1) AFTER CHANGE STEEL 0.8 mm (CHASSIS) PRESS BOSS | (2) BEFORE CHANGE STEEL 0.8 mm (CHASSIS) PROCESSING/FORGING BOSS |
|---|---|---|
| COMPRESSIVE STRENGTH ($N/cm_2$) | 24.2 22.6 21.6 | 21.6 23 24 |

It can be recognized in the Table 1 that although the boss according to the present embodiment is fabricated by means of the press method with a low fabrication cost, it secures at substantially the same strength as the boss fabricated by means of the conventional forging method.

Figure 8:
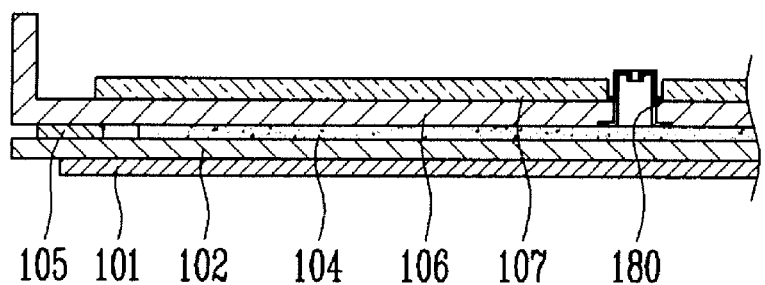
FIG. 8 is a cross-sectional view of a plasma display device according to one embodiment of the present invention.

The boss fabricated according to the present embodiment, can be used to fabricate the plasma display device having the same overall structure as the FIG. 8. In this case, the plasma display device implemented by using the boss according to the present embodiment includes a plasma display panel 102; a filter 101 attached to a surface of the plasma display panel 102; a chassis base 106; a double-faced adhesive tape 104 between the plasma display panel 102 and one side surface of the chassis base 106; a boss 180 coupled vertically to another side surface of the chassis base 106; and a control circuit board 107 coupled to the boss 180.

As described herein, the boss 180 according to the idea of the present embodiment includes a boss cylinder; an attaching head formed at one end of the boss cylinder and having area larger than the horizontal cross-sectional area of the boss cylinder; a supporting jaw formed by cutting a portion of the boss cylinder and having the portion protrude to the outside; and an undercut having a shape comparable to a portion of the boss cylinder emptied when forming the supporting jaw, as shown in the FIGS. 3A to 7B. In addition, it can further include a connection hole passing an external structure such as a screw or conductor, etc. for attaching the control circuit board the boss cylinder.

The boss having above structure according to the present embodiment is capable of being fabricated by means of the press method and at a low cost.

In addition, the boss according to the present embodiment is capable of sufficiently securing the coupling force with a thin chassis base.

Although exemplary embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A plasma display device comprising: a plasma display panel; a chassis base attached to a surface of the plasma display panel;
    a coupling boss protruding from the chassis base, the protruding being distal from the plasma display panel; and
    a control circuit board coupled to the coupling boss,
    wherein the coupling boss comprises: a boss cylinder; an attaching head at one end of the boss cylinder, the attaching head having a horizontal cross-sectional area larger than a horizontal cross-sectional area of the boss cylinder;
    a supporting jaw proximal to the attaching head and protruding from the boss cylinder, the supporting jaw being bent outward from a wall of the boss cylinder; and
    an undercut between the attaching head and the supporting jaw, the undercut having a volume substantially the same as a volume of the supporting jaw.

2. The plasma display device as claimed in claim 1, wherein the attaching head includes means for preventing rotation when coupled with the chassis base.

3. The plasma display device as claimed in claim 1, wherein the horizontal cross-sectional area of the attaching head is polygonal.

4. The plasma display device as claimed in claim 1, further comprising a connection hole at an end of the boss cylinder distal from the attaching head for coupling the control circuit board to the boss cylinder.

5. The plasma display device as claimed in claim 4, wherein the connection hole is threaded.

6. The plasma display device as claimed in claim 5, wherein the boss cylinder, the attaching head, the supporting jaw, and the undercut are integrally formed.

7. The plasma display device as claimed in claim 1, wherein the coupling boss is press-insertable into the chassis base, and the attaching head and the supporting jaw are each engaged with the chassis base upon the coupling boss being press-inserted into the chassis base.

8. The plasma display device as claimed in claim 1, wherein the attaching head is depressed into the chassis base after a press-inserting process.

9. A coupling boss comprising: a boss cylinder; an attaching head at one end of the boss cylinder, the attaching head having a horizontal cross-sectional area larger than a horizontal cross-sectional area of the boss cylinder;
    a supporting jaw proximal to the attaching head and protruding from the boss cylinder, the supporting jaw being bent outward from a wall of the boss cylinder; and
    an undercut between the attaching head and the supporting jaw, the undercut having a volume substantially the same as a volume of the supporting jaw.

10. The coupling boss as claimed in claim 9, wherein the attaching head includes means for preventing rotation when coupled with a plate.

11. The coupling boss as claimed in claim 9, wherein the horizontal cross-sectional area of the attaching head is polygonal.

12. The coupling boss as claimed in claim 9, further comprising a connection hole at an end of the boss cylinder distal from the attaching head.

13. The coupling boss as claimed in claim 12, wherein the connection hole is threaded.

14. The coupling boss as claimed in claim 9, wherein the boss cylinder, the attaching head, the supporting jaw, and the undercut are integrally formed.

15. The coupling boss as claimed in claim 9, wherein the coupling boss is press-insertable into a chassis base, and the attaching head and the supporting jaw are each engaged with the chassis base upon the coupling boss being press-inserted into the chassis base.

16. The coupling boss as claimed in claim 15, wherein the attaching head is depressed into the chassis base after a press-inserting process.

* * * * *